United States Patent
Harris et al.

(10) Patent No.: US 8,563,930 B2
(45) Date of Patent: Oct. 22, 2013

(54) SYSTEM AND METHOD OF MODULATING ELECTRICAL SIGNALS USING PHOTOCONDUCTIVE WIDE BANDGAP SEMICONDUCTORS AS VARIABLE RESISTORS

(75) Inventors: John Richardson Harris, Patterson, CA (US); George J. Caporaso, Livermore, CA (US); Stephen E. Sampayan, Manteca, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 1030 days.

(21) Appl. No.: 12/426,143

(22) Filed: Apr. 17, 2009

(65) Prior Publication Data
US 2009/0261258 A1    Oct. 22, 2009

Related U.S. Application Data

(60) Provisional application No. 61/045,924, filed on Apr. 17, 2009.

(51) Int. Cl.
*G01J 5/00*    (2006.01)
*H01L 31/09*    (2006.01)
*H01L 31/08*    (2006.01)

(52) U.S. Cl.
USPC .......... 250/338.1; 250/200; 338/15; 332/149; 332/150

(58) Field of Classification Search
USPC ............. 338/15; 250/214; 332/149, 153, 163, 332/165; 315/501
See application file for complete search history.

(56) References Cited

U.S. PATENT DOCUMENTS 2,181,170 A  *  11/1939  Brown ........................... 329/359
2,803,779 A  *  8/1957  Grace et al. ..................... 315/10

(Continued)

FOREIGN PATENT DOCUMENTS

DE    3912240 A1    11/1989

OTHER PUBLICATIONS

Owens, et al., "Compound Semiconductor radiation detectors", Nuclear Instruments & Methods in Physics Research, 531, pp. 19-37 (2004).

(Continued)

*Primary Examiner* — David Porta
*Assistant Examiner* — Yara Green
(74) *Attorney, Agent, or Firm* — James S. Tak (57) ABSTRACT

A system and method for producing modulated electrical signals. The system uses a variable resistor having a photoconductive wide bandgap semiconductor material construction whose conduction response to changes in amplitude of incident radiation is substantially linear throughout a non-saturation region to enable operation in non-avalanche mode. The system also includes a modulated radiation source, such as a modulated laser, for producing amplitude-modulated radiation with which to direct upon the variable resistor and modulate its conduction response. A voltage source and an output port, are both operably connected to the variable resistor so that an electrical signal may be produced at the output port by way of the variable resistor, either generated by activation of the variable resistor or propagating through the variable resistor. In this manner, the electrical signal is modulated by the variable resistor so as to have a waveform substantially similar to the amplitude-modulated radiation.

26 Claims, 8 Drawing Sheets

(56) References Cited

U.S. PATENT DOCUMENTS

| | | | |
|---|---|---|---|
| 3,192,387 | A | 6/1965 | Goodman |
| 4,010,376 | A | 3/1977 | Duck |
| 4,104,526 | A * | 8/1978 | Albert .......................... 378/106 |
| 6,469,292 | B1 | 10/2002 | Ogimoto et al. |
| 7,880,375 | B2 * | 2/2011 | Dijon et al. .................... 313/495 |
| 7,943,419 | B2 * | 5/2011 | Baldo et al. .................... 438/99 |
| 2005/0214451 | A1 * | 9/2005 | Miyake .......................... 427/160 |
| 2007/0092812 | A1 | 4/2007 | Caporaso et al. |
| 2008/0123771 | A1 * | 5/2008 | Cranford et al. ............. 375/285 |

OTHER PUBLICATIONS

Ikezi, et al., "Soliton Generation at 10 MW Level in the very high frequency band", Appl. Phys. Lett., 58 (9), pp. 986-987 (Mar. 4, 1991).

Bergeret, et al., "Short Pulse photoemission from a dispenser cathode", Nuclear Instruments and Methods in Physics Research A301, pp. 389-394 (1991).

Gold, et al., "Review of High-Power Microwave Source Research", Rev. Sci. Instrum. American Institute of Physics, 68 (11), pp. 3945-3974, (Nov. 1997).

Siergiej, et al., "4H-SiC Continuous Wave SITs", Proceedings of the 1999 57th Annual Device Research Conference Digest (DRC), pp. 98-99 (Jun. 28-Jun. 30, 1999).

Kashin, et al., "Experimental Investigation of a Light-Controlled Nonlinear Scatterer", Technical Physics Letters, vol. 27, No. 4, pp. 275-278 (2001).

Neumann, et al., "Electron beam modulation using a laser-driven photocathode", Science Direct, Nuclear Instruments and Methods in Physics Research, 507, pp. 498-501 (2003).

Neumann, et al., "Production of Photoemission-modulated beams in thermionic electron gun", Review of Scientific Instruments 76, 8 pages (2005).

Harris, et al., "Longitudinal density modulation and energy conversion in intense beams", The American Physical Society, Physical Review, 76, pp. 026402-01-026402-14 (2007).

Caporaso, et al., "High Gradient Induction Accelerator", Proceedings of PAC07, 03 Linear Colliders, pp. 857-861 (2007).

Sullivan, et al., "6H-SiC Photoconductive Switches Triggered at Below Bandgap Wavelengths", IEEE, pp. 980-985 (2007).

Mazumder, et al., "Optically-triggered Power Transistor (OTPT) for Fly-by-light (FBL) and EMI-sisceptible Power Electronics", Department of Electrical and Computer Engineering, 8 pages (2005).

* cited by examiner

SYSTEM AND METHOD OF MODULATING ELECTRICAL SIGNALS USING PHOTOCONDUCTIVE WIDE BANDGAP SEMICONDUCTORS AS VARIABLE RESISTORS

CLAIM OF PRIORITY IN PROVISIONAL APPLICATION

This application claims the benefit of U.S. Provisional Application No. 61/045,924 filed Apr. 17, 2009, entitled, "Radiation-modulated Photoconductive Device and System" by John R. Harris et al, and incorporated by reference herein.

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to photoconductive wide bandgap semiconductor materials typically used as solid state switches, and more particularly to the use of photoconductive wide bandgap semiconductor materials as variable resistors operating in non-avalanche mode for producing modulated electrical signals for use in, for example, high frequency modulation applications such as microwave transmission or modulating charged particle beams.

BACKGROUND OF THE INVENTION

Wide band gap semiconductors are materials having a high breakdown voltage and are thus often used as solid state switches for high-temperature and power switching applications involving large electric fields. While the exact threshold of what bandgap range is considered "wide" often depends on the application, wide bandgap semiconductor materials are generally considered to be those having bandgaps greater than about 1.6 or 1.7 eV. Furthermore, such wide bandgap materials are known to be photoconductive, i.e. characterized by increased electrical conductivity in response to illumination. Example types of include, silicon carbide, aluminum nitride, gallium nitride, boron nitride, and diamond. In particular, both gallium nitride and silicon carbide are well known robust materials well suited for such switching applications.

Various pulsed power applications are known which employ such photoconductive wide bandgap semiconductor materials (hereinafter "PWBSM") as photoconductive solid state switches (PCS). Typical materials for a PCS are Si or GaAs, but because of the limited photocurrent current capacity, require operation in an avalanche or so called high-gain mode to generate usable energy levels. In avalanche mode operation, the device is bi-stable (i.e., either "off" or "on") and is triggered "on" optically and stays "locked-on" until current cessation.

One example application using pulsed power is in the field of high power microwave generation, where such photoconductive materials are also used as photoconductive solid state switches. However, because they are operated in avalanche mode this produces broadband, low radiated energy, is not real-time-adaptive, and can cause communication fratricide. Spectral energy content is low because efficient energy radiation occurs mainly during the pulse transition. It is notable that traditionally, high-power microwave sources have been vacuum electronic devices, such as klystrons. Alternate approaches include nonlinear transmission lines. Both of these techniques have inherent problems. Vacuum electronic devices tend to be bulky and expensive, while nonlinear transmission lines rely on specialized materials which are often difficult to obtain and poorly characterized.

SUMMARY OF THE INVENTION

One aspect of the present invention includes a system for producing modulated electrical signals comprising: a variable resistor comprising a photoconductive wide bandgap semiconductor material whose conduction response to changes in amplitude of incident radiation is substantially linear throughout a non-saturation region thereof to enable operation in non-avalanche mode; a modulated radiation source for producing amplitude-modulated radiation with which to direct upon the variable resistor and modulate the conduction response thereof; and a voltage source and an output port, both operably connected to the variable resistor so that an electrical signal produced at the output port by way of the variable resistor is modulated by the variable resistor so as to have a waveform substantially similar to the amplitude-modulated radiation.

Another aspect of the present invention includes a method of producing modulated electrical signals comprising: providing a voltage source, an output port, and a variable resistor operably connected to the voltage source and the output port so that an electrical signal is produced at the output port by way of the variable resistor, said variable resistor comprising a photoconductive wide bandgap semiconductor material whose conduction response to changes in amplitude of incident radiation is substantially linear throughout a non-saturation region thereof, whereby the variable resistor is operable in non-avalanche mode; and directing upon the variable resistor amplitudemodulated radiation produced by a modulated radiation source to modulate the conduction response of the variable resistor, so that the electrical signal produced at the output port is modulated by the variable resistor so as to have a waveform substantially similar to the amplitude-modulated radiation.

Another aspect of the present invention includes a photoconductivity-modulated variable resistor device comprising: a photoconductive wide bandgap semiconductor material (PWBSM) whose conduction response to changes in amplitude of incident radiation is substantially linear throughout a non-saturation region thereof, whereby the PWBSM is operable in non-avalanche mode as a variable resistor; and a modulated radiation source for producing amplitude-modulated radiation with which to direct upon the PWBSM so that the conduction response induced thereby in the PBWSM has a waveform substantially similar to the amplitude-modulated radiation.

Generally, the present invention describes techniques for using photoconductive wide bandgap semiconductor materials (PWBSM) to modulate electrical signals by modulating the conduction response of the PWBSM. This is made possible by the demonstrated transconductance-like properties of PWBSM materials, which have shown fast (<1 ns rise-time), high voltage (>15 kV/mm), high current (>1 kA/cm2), and phototransistor-like modulation capabilities (>300 MHz), such as for example, in a compact, stacked, transmission-line structure. This capability enables various applications for direct manipulation of high voltage electrical signals. Illustrative uses of the present invention include, for example, compact high power microwave or RF generation, and energy-modulation of charged particle beams (without use of the photoelectric effect) in directed energy systems, i.e. pulsed power for accelerators and other scientific instruments. And various types of PWBSM may be used for the present invention, such as silicon carbide, gallium nitride, aluminum nitride, boron nitride, and diamond.

Figure 2:
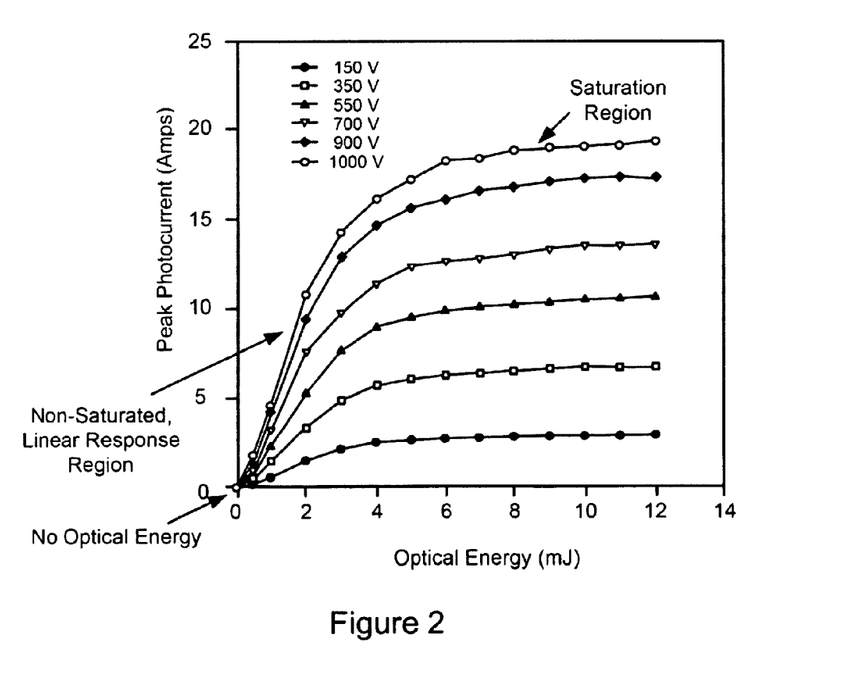
FIG. 2 is a graph showing the conduction response of a SiC material to optical energy at various voltage levels, and illustrating the substantially linear response of a non-saturated region.

Recent data has shown that SiC, when subjected to visible optical energy will vary in resistance based on the intensity of that optical energy. As such, SiC and other PWBSMs used in the present invention function as radiation (e.g. light)-controlled resistors, whose resistance decreases when radiation is directed thereupon (e.g. illuminated). FIG. 2 shows the results and typical behavior of SiC under the influence of such visible optical energy, from experiments performed by Applicants at Lawrence Livermore National Laboratory. On the x-axis is the intensity of the visible optical energy onto the SiC material. The resultant current flow is shown on the y-axis for multiple voltages applied across the material. FIG. 2 shows details the current through the SiC switch at various voltages resulting from changing the optical intensity to the switch, and shows high current (>1 kA/cm) capability of wide band gap materials (SiC and GaN) under high gradient (>27 MV/m) switching applications. For approximately a 0 to 2 mj change in optical energy, the device operates in an essentially linear mode from a dark current of about 1 nA to peak current. For this particular data this current was about 20 A at 1 kV. At higher optical energy>2 mJ, a saturation point is reached where the device achieves a minimum resistance of about 1Ω. The conduction response curve shown in FIG. 2 can be characterized as having a saturated region, and a non-saturated region.

It is clearly evident from FIG. 2 that the non-saturated region has a substantially linear response that is similar to a typical transistor device. From this data, it can be seen that the SiC material operates with a transconductance like property of the form: $Gm=\Delta Iout/\Delta \zeta in$, where $\zeta in$ is the controlling input parameter. In the case of a simple transistor, $\zeta in$, would be the base current or for a vacuum tube, the control grid voltage. For the SiC material, this parameter is the optical or other radiation energy producing a conduction response. Although the very linear, lower current region was illustrated for clarity, SiC exhibits this transconductance property beyond the maximum current of >1·kA/cm2 in our particular devices. And as with transistor and vacuum tube technologies these materials exhibit a steep high gain linear regime from 0-2 mj and a decreased slope saturation region up to >30 mJ. Thus, when the material is operated in the substantially linear non-saturated region, amplification of an applied modulation to the optical pulse will result in amplification of the applied signal. When properly configured, these switches are able to close and open on timescales of nanoseconds or faster, i.e. high frequency modulation. It is notable that an uncontrolled bi-stable "high gain" mode was never observed where the optical energy only triggers the device into a fully conducting state with recovery occurring after the applied potential is removed.

Furthermore, any type of radiation capable of sufficiently exciting the charge carriers in the wide bandgap material may be used to modulate the conductance response of the PWBSM variable resistor, including electromagnetic radiation, and particle radiation, including for example, electron, proton, neutron, etc. It is notable that one difficulty of an arrangement using visible optical energy to modulate is that intense visible optical energy may difficult to produce. But fortunately, the materials of interest respond to both electromagnetic radiation and particle radiation equally well.

Two basic types of modulation schemes include: (1) "direct modulation," where the conduction response of the PWBSM variable resistor generates the modulated electrical signal at the output port, and (2) "reflectance modulation" where the conduction response to amplitude-modulated radiation from a modulated radiation source, substantially impresses the modulation waveform on an incident pulse propagating in a transmission line arising from impedance mismatching.

BRIEF DESCRIPTION OF THE DRAWINGS

The accompanying drawings, which are incorporated into and form a part of the disclosure, are as follows.

DETAILED DESCRIPTION

Figure 1:
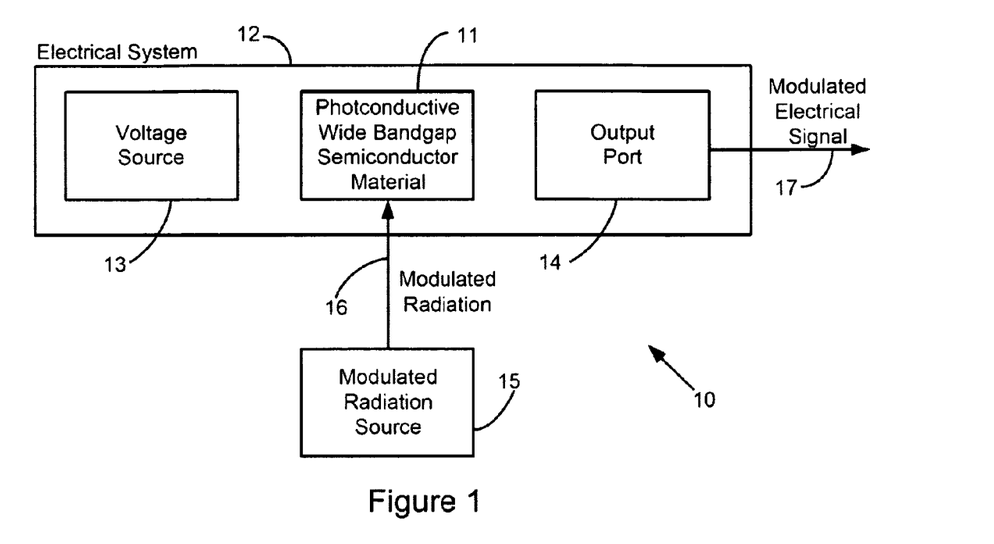
FIG. 1 is a schematic view of a general embodiment of the system for producing modulated electrical signals of the present invention.

Turning now to the drawings, FIG. 1 shows a schematic view of a general embodiment of the system for producing modulated electrical signals of the present invention, generally indicated at reference character 10. The system includes a photoconductive wide bandgap semiconductor material ("PWBSM") embedded as a variable resistor 11 in an electrical system 12. It is appreciated that the manner of deployment in the electrical system can vary depending on the electrical arrangement of the system, such as in a voltage divider, transmission line, pulse forming line, etc. (to be discussed in greater detail below), and can also be application specific. Generally, however, the PWBSM-based variable resistor 11 is operably connected to both a voltage source 13 and an output port 14 so that an electrical signal 17 is produced at the output port by way of the variable resistor 11. In other words, the electrical signal is either generated by activation/modulation of the variable resistor or propagated to simply pass through "via" the variable resistor. And the output port can be comprised of at least two output terminals/electrodes. It is appreciated that another general embodiment of the present invention includes the variable resistor device which includes the photoconductive variable resistor 11 and the modulated radiation source 15, as well as performing the conductance modulation of the PWBSM-based variable resistor to modulate an electrical output signal.

Modulated Radiation Source

As shown in FIG. 1, the system 10 also includes a modulated radiation source, indicated at reference character 15, which produces modulated radiation 16 that is directed upon the variable resistor 11 to modulate its conduction response. As discussed in the Summary, the PWBSM variable resistor has a continuous conduction response characterized by a saturation region and a non-saturation region. And in the non-saturation region of operation/activation the conduction response is substantially linear. As such, the modulated radiation 16 produced by the modulated radiation source 15 preferably operates to modulate the conduction response of the variable resistor in the substantially linear region, and thereby operate is a manner similar to an amplifier/transistor. It is notable that the variable resistor is not used as a switch which implies bi-stable "on" and "off" operation.

Figure 3:
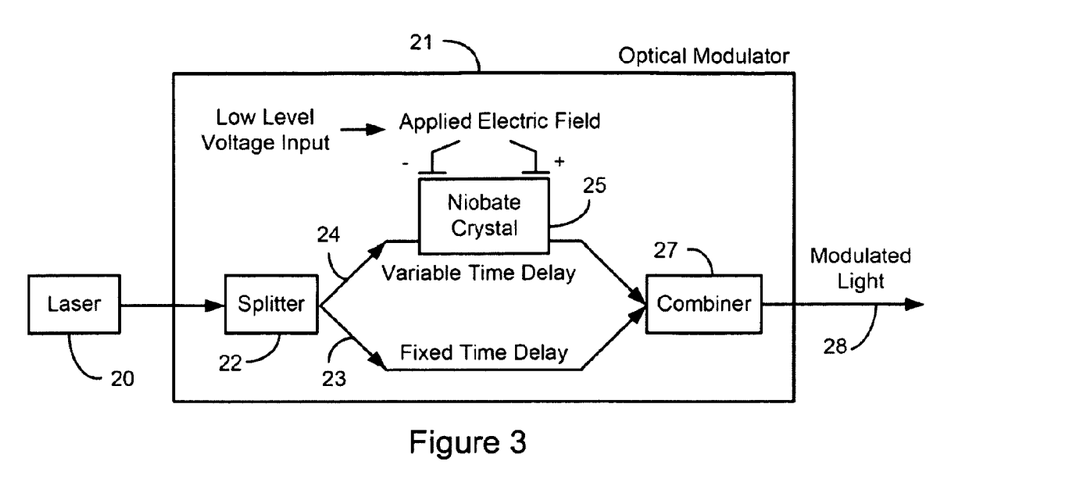
FIG. 3 is a schematic view of a first exemplary embodiment of the modulated radiation source of the present invention, for producing modulated light by optically modulating light generated by a light source, e.g. laser.

The modulated radiation source 15 of FIG. 1 generally functions to generate and amplitude-modulate radiation, which may be either electromagnetic radiation, e.g. visible light or x-ray, or particle radiation, e.g. electron, proton, or neutron. Thus, the modulated radiation source may produce, for example, an optical pulse train (from a laser) to be directed upon a single PWBSM variable resistor to produce high voltage output pulse train, or a continuously variable analog light signal to be directed upon a single PWBSM variable resistor. FIG. 3 shows a schematic view of a first exemplary embodiment of the modulated radiation source shown as a modulated electromagnetic radiation source. In particular, the modulated electromagnetic source produces modulated light 28 using a optical modulator 21 to optically modulate light generated by a light source, e.g. laser 20. While the optical modulator 21 may employ various modulating techniques, FIG. 3 shows one particular method using a splitter 22 which splits the incoming light into a variable time delay path 24 and a fixed time delay path 23. Light following the variable time delay path is shown passing through a lithium niobate crystal 25 which controls the delay of the optical signal based on a low level voltage input signal. The two paths are recombined at a combiner 27 to produce the modulated light 28. Other embodiments of the modulator may include, for example, an acousto-optic (AO) modulator, a Kerr cell, a Pockel cell, and a Faraday rotator with polarizer.

Figures 4, 5:
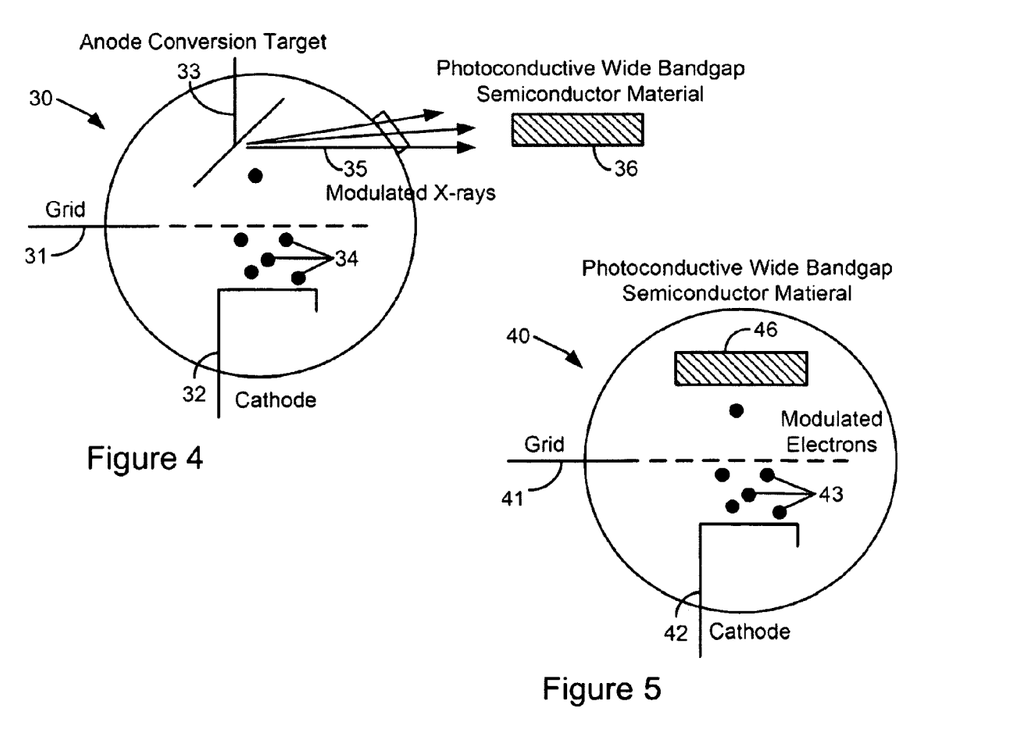
FIG. 4 is a schematic view of a second exemplary embodiment of the modulated radiation source of the present invention, for modulating the production of electrons to produce modulated x-rays with which to modulate the conduction response of the photoconductive variable resistor.
FIG. 5 is a schematic view of a third exemplary embodiment of the modulated radiation source of the present invention, for producing modulated electron particles with which to directly modulate the conduction response of the photoconductive variable resistor.

FIGS. 4 and 5 show two alternative embodiments of the modulated radiation source 15 of FIG. 1. In particular, FIG. 4 shows a schematic view of a second exemplary embodiment of the modulated radiation source, indicated at 30, for modulating the production of electrons 34 to produce modulated x-rays 35 with which to modulate the conduction response of the photoconductive variable resistor 36. A cathode 32 is provided, as well as an anode conversion target 33, and a grid electrode 31 for controlling the electron production. Modulating the electron production also modulates the x-ray generation (i.e. the x-ray intensity), The modulated x-rays are in turn directed upon the PWBSM 36 to modulate its conduction response.

And FIG. 5 shows a schematic view of a third exemplary embodiment 40 of the modulated radiation source similar to FIG. 4, but using the grid electrode 41 to modulate the production of electrons producing modulated electron particles 43 from the cathode 42 with which to directly modulate the conduction response of the photoconductive variable resistor 46. While not shown in the figures, any type of particle radiation, such as radioactive particles, protons, neutrons, etc. (subatomic particles), may be modulated by providing a particle modulator capable of modulating the type of particle.

Thus in a preferred embodiment, the particle radiation source has a pointed tip, from which the particle modulate operates to modulate extraction of particles from the pointed tip.

Direct Modulation

Figure 6A:
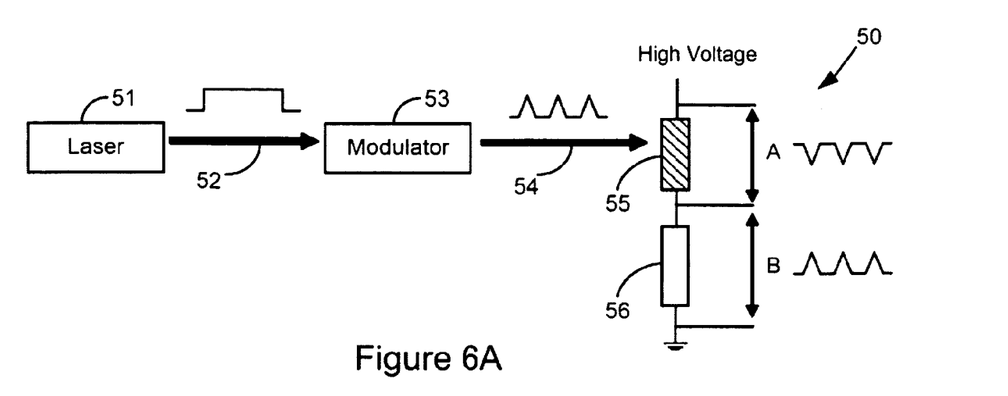
FIG. 6A is a schematic view of a first exemplary embodiment of a direct modulation arrangement of the present invention, whereby the conduction response of the PWBSM generates the modulated electrical signal at an output port. In particular, the embodiment is arranged as a voltage divider.
Figure 6B:
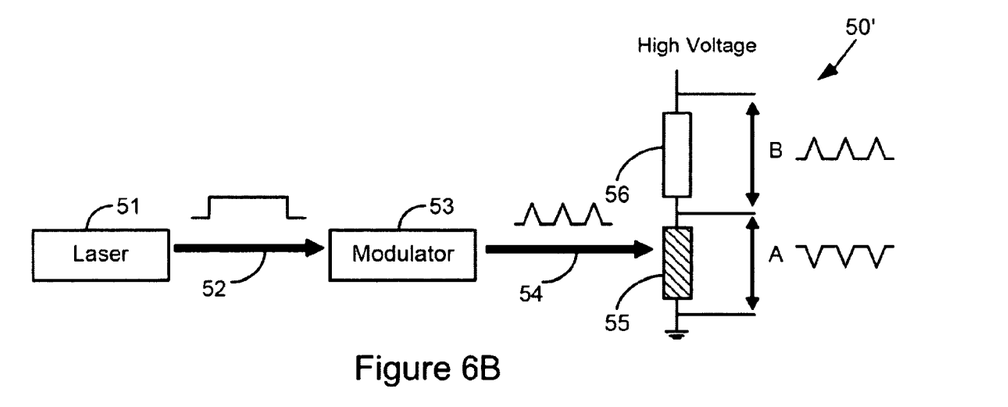
FIG. 6B is a schematic view of a second exemplary embodiment (voltage divider arrangement) similar to FIG. 6A, but with the positions of the load and PWBSM reversed.
Figure 7:
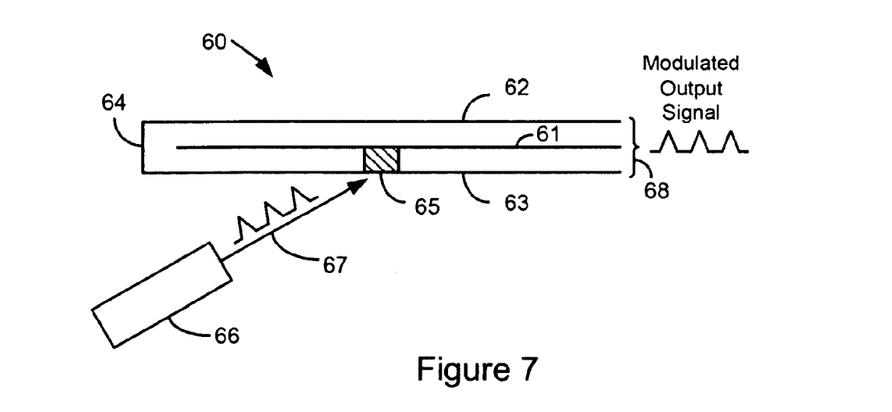
FIG. 7 is a schematic view of a third exemplary embodiment of a direct modulation arrangement of the present invention, using a pulse forming line to generate the modulated electrical signal at an output port.

FIGS. 6A, 6B and 7 illustrate various exemplary embodiments of a "direct modulation" arrangement of the present invention, whereby the conduction response of the PWBSM variable resistor generates the modulated electrical signal at the output port. This arrangement take advantage of the PWBSM variable resistor's ability to quickly go from high impedance to low impedance in a manner analogous to the operation of a transistor. Generally, in this approach, a laser or other appropriate radiation source is used to produce radiation of a type and amplitude (e.g. intensity) which is sufficient to activate the switch. A modulator (e.g. an optical modulator) is then used to convert the laser light into the correct pulse shape. This could be accomplished, for example, by an acoustic optical modulator, a series of mirrors and optical delay lines, Pockels cells, or other techniques.

In particular, FIG. 6A is a schematic view of a first exemplary embodiment 50 of the direct modulation arrangement that is arranged as a voltage divider. As shown, the PWBSM variable resistor 55 is serially arranged between a voltage source (shown as a high voltage source) and a load 56, which may be a load resistor. A laser 51 is shown generating an unmodulated optical signal 52 which is modulated by optical modulator 53 to produce a modulated optical signal 54, which in turn is directed upon the resistor 55. In this manner, a modulated electrical signal is produced across the resistor at output port A, as well as across the load 56 at output port B. Similarly, FIG. 6B is a schematic view of a second exemplary embodiment 50' (voltage divider arrangement), but with the positions of the load 55 and PWBSM resistor 56 reversed. Here too a modulated electrical signal is produced at both the output ports A and B. Because the PWBSM is essentially an open circuit when not illuminated, all of the voltage is seen across the PWBSM resistor, rather than across the load. When the switch closes, most of the voltage drop now occurs across the load. Because the switch is capable of rapid switching, the fast optical pulse train is replicated in the high voltage pulse trains appearing at A and B. For production of microwaves, a microwave-frequency optical modulation would be required, with an antenna or transmission line connected at A or B.

FIG. 7 illustrates a third exemplary embodiment of the direct modulation arrangement of the present invention, generally indicated at reference character 60. Here, a pulse forming line is used to generate the modulated electrical signal at an output port 68. While three electrodes are shown in FIG. 7, it is appreciated that at least two electrodes may generate a pulse. In any case, the pulse forming line shown in FIG. 7 has a center electrode 61 that is a pre-charged to a voltage by connection to a voltage source (not shown). The other two electrodes 62 and 63 on opposite sides of the pre-charged electrode 61 are held at a ground potential, with the electrodes 61 and 63 electrically connected by backshort 64. With this arrangement, when amplitude-modulated radiation 67 generated by modulated radiation source 66 is directed upon the PWBSM 65, a modulated pulse is generated at the output port 68.

Reflectance Modulation

Figure 8A:
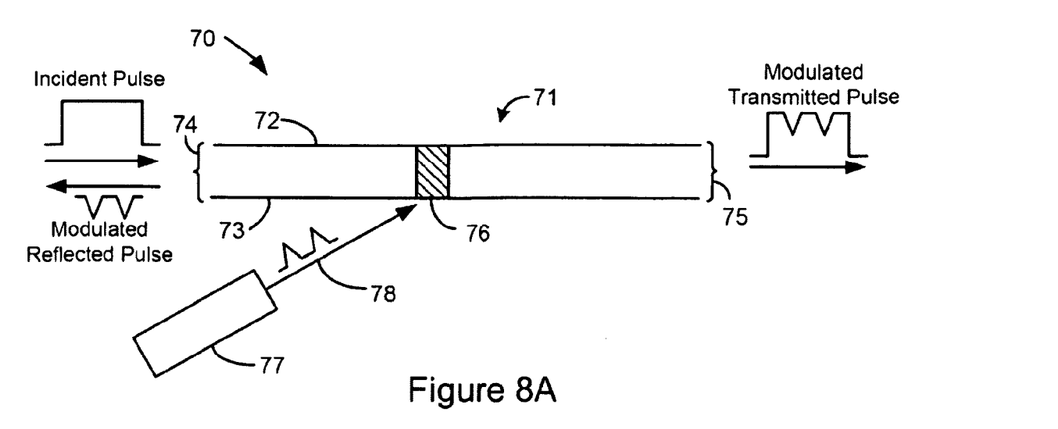
FIG. 8A is a schematic view of a first exemplary embodiment of a reflectance modulation arrangement of the present invention, where the conduction response to amplitude-modulated radiation impresses the modulation waveform on an incident pulse propagating in a transmission line.
Figure 8B:
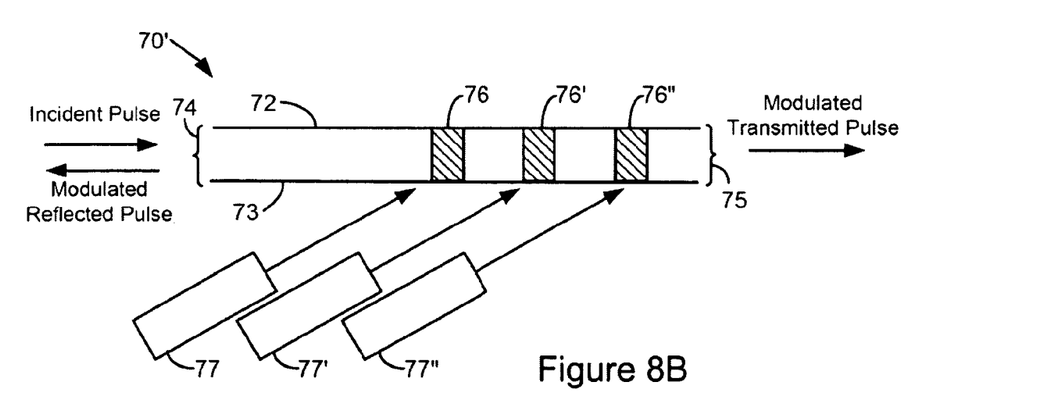
FIG. 8B is a schematic view of a second exemplary embodiment of the reflectance modulation arrangement of the present invention, similar to FIG. 8A, but having additional conductance modulated sections located in line between the input end and the output end, with each section modulated by an independent modulated radiation source.
Figure 8C:
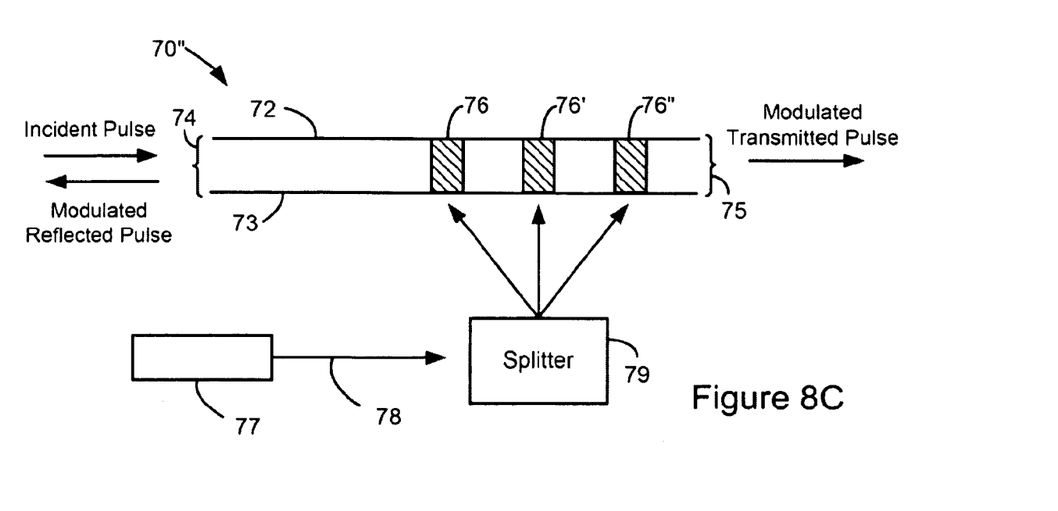
FIG. 8C is a schematic view of a third exemplary embodiment of the reflectance modulation arrangement of the present invention, similar to FIG. 8B, but having a single modulated radiation source which conductance modulates all of the conductance modulated sections in the transmission line.

In contrast to the direct modulation arrangements previously described, FIGS. 8A-8C illustrate various exemplary embodiments of a "reflectance modulation" arrangement. In particular, FIG. 8A shows a schematic view of a first exemplary embodiment of a reflectance modulation arrangement, indicated at reference character 70, of the present invention, where the conduction response of PWBSM resistor 76 to amplitude-modulated radiation 78 from modulated radiation source 77, substantially impresses the modulation waveform on an incident pulse propagating in a transmission line 71 (shown comprising electrodes 72 and 73 extending between an input end 74 and an output end 75). It is appreciated that the waveform will almost never impress exactly the same, but rather substantially the same. Moreover, substantially impressing includes waveform inversion, as well as uniform variations in amplitude and/or phase while maintaining the fundamental shape of the waveform.

In this case, the voltage source is preferably a pulse power source. Conductance modulation of the PWBSM in the transmission line controls the impedance mismatch between the PWBSM and the transmission line so that an incident pulse (generated elsewhere) that is propagated through the transmission line is partially reflected and partially transmitted, with the pulse shape of the photomodulation (i.e. optical pulse train) being impressed on both the reflected and transmitted pulses. Thus it is preferably that the properties of the PWBSM resistor and the properties of the transmission line are impedance matched so that no reflection due to impedance mismatch would occur when the switch was not illuminated. This can be achieved in several ways, including by changing the material properties and the geometry of the switch and/or the line) When the PWBSM is illuminated, its impedance will drop, and any high voltage pulse propagating along the transmission line will be partially reflected and partially transmitted. Because the PWBSM responds promptly to changes in illumination, the modulated optical pulse train will result in a changing impedance mismatch at the variable resistor. This will cause the optical pulse train structure to be replicated in both the transmitted voltage pulse and in the reflected voltage pulse. For production of microwaves, the transmitted pulse, the reflected pulse, or both, would be carried via transmission lines to an antenna. More complex modulations may be generated by using additional inline photoconductive sections, as discussed next.

FIG. 8B is a schematic view of a second exemplary embodiment of the reflectance modulation arrangement 70' of the present invention, similar to FIG. 8A. However, in this case, additional conductance modulated sections 76' and 76" are provided and located in line between the input end and the output end, with each section modulated by an independent modulated radiation source, 77' and 77".

FIG. 8C is a schematic view of a third exemplary embodiment of the reflectance modulation arrangement 70" of the present invention, similar to FIG. 8B. However, in this case, a single modulated radiation source 77 produces a modulated signal 78 to modulate the conductance responses of all of the conductance modulated sections in the transmission line, such as by a splitter 79.

Stacked Arrangement of Pulse Forming Lines

Figure 9:
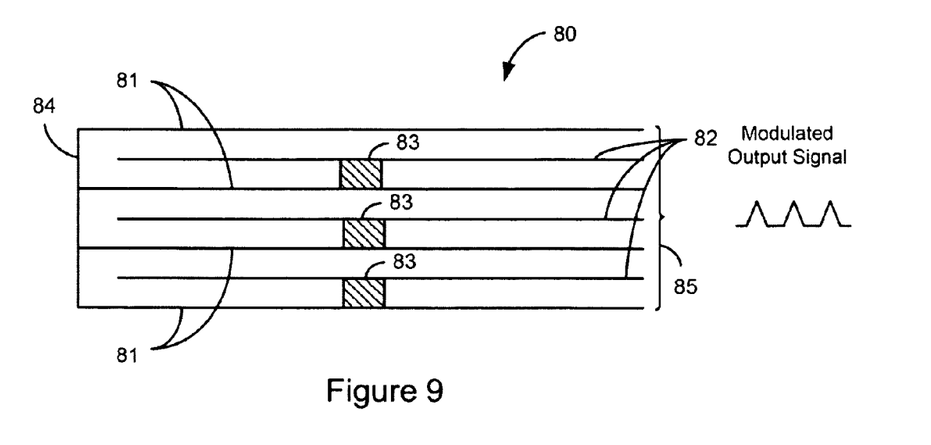
FIG. 9 is a schematic view an exemplary stacked embodiment of the direct modulation arrangement, having multiple PWBSM variable resistors embedded in stacked pulse forming lines so that the modulated signal at the output port is additive.

FIG. 9 is a schematic view an exemplary stacked embodiment of the direct modulation arrangement 80, having multiple PWBSM variable resistors 83 embedded in stacked pulse forming lines (comprising precharged center electrodes 82, and grounded electrodes 81 which are connected by backshort 84) so that the modulated signal at the output port 85 is additive. This arrangement is if more voltage or current is needed than can be provided by, for example, a single pulse forming line, or a single voltage divider, so that multiple stages may be used with the signals summed together. In particular, a "dielectric wall accelerator" geometry may be used, such as shown in FIG. 9, or an inductive voltage adder configuration known in the art. These geometries use stacks of transmission lines to apply voltage to a central conductor (or charged particle beam).

Phased Array of Modulated Electrical Signal Outputs

Figure 10:
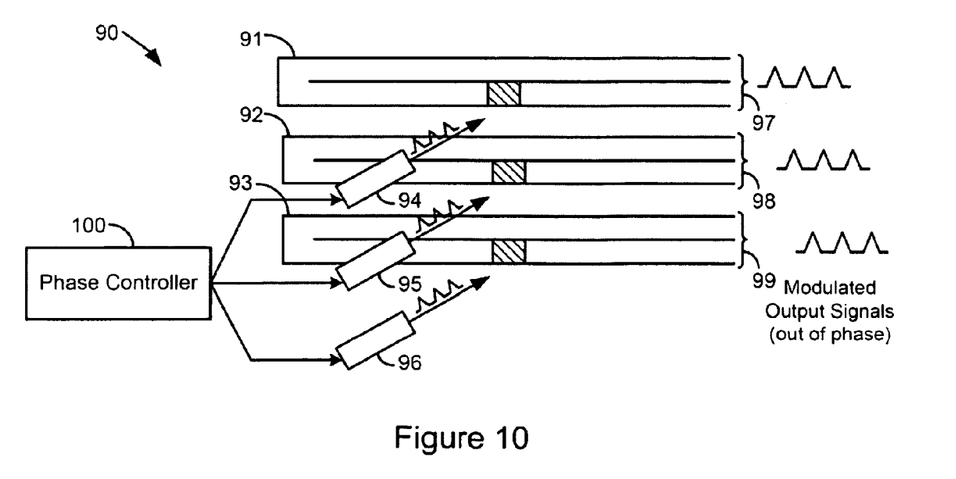
FIG. 10 is a schematic view an exemplary phased array embodiment of the present invention, having multiple PWBSM variable resistors embedded in separate pulse forming lines and independently modulated by respective modulated radiation sources with a phase controller controlling the relative phases thereof.
Figure 14:
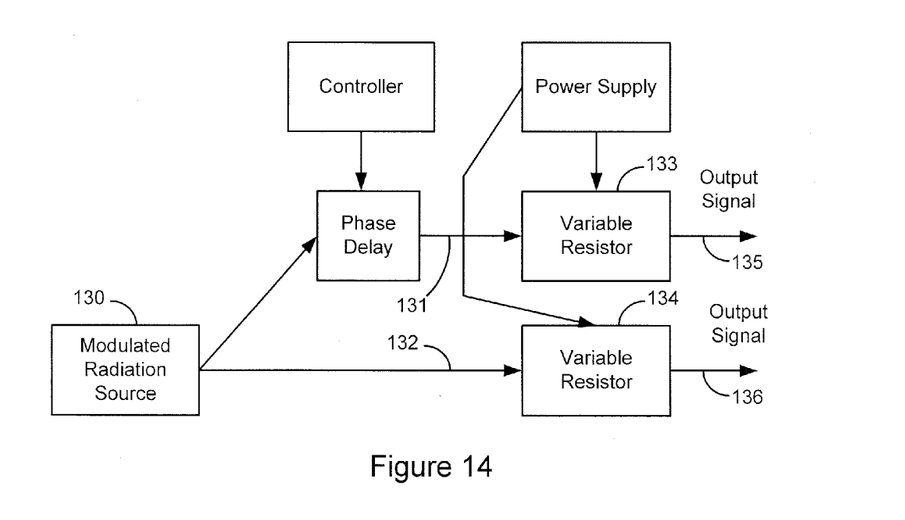
FIG. 14 is an alternative embodiment to FIG. 10, showing a schematic view of a phase array embodiment using a single modulated radiation source to generate phase-controlled amplitude modulated radiation directed to different variable resistors.

FIG. 10 is a schematic view an exemplary phased array embodiment 90 of the present invention, having multiple PWBSM variable resistors embedded in separate pulse forming lines 91-93 and independently modulated with phase controlled amplitude-modulated radiation. FIG. 10 shows a phase controller 100 controlling multiple modulated radiation sources 94-96, to control the relative phases of the amplitude-modulated radiations to produce out of phase modulated output signals 97-99. It is appreciated, however, that a phase controller may be used to phase control a single modulated radiation source to produce multiple phase-controlled amplitude modulated radiations, to be directed upon the multiple variable resistors. And FIG. 14 shows an alternative embodiment to FIG. 10, showing a schematic view of a phase array embodiment using a single modulated radiation source 130 to generate phase-controlled amplitude modulated radiation 131, 132 directed to different variable resistors, 133, 134, to produce out of phase modulated output signals 135 and 136.

Example Application: High Power Microwave Generation

Present high voltage amplifier or high power microwave (HPM) generation generally requires use of cumbersome vacuum electronics technology (i.e., vacuum power tubes, magnetrons, klystrons, gyratrons, etc.) or large pulsed power systems. Laser triggered, photoconductive switches (PCS) have been employed in compact pulsed power system in which a prompt transition in the high voltage pulse generates HPM. However, most pulsed power driven high power microwave (HPM) systems are very broadband. The net result is that although a certain amount of neutralization effectiveness can be realized, excessive electromagnetic energy can radiate to friendly communication frequencies and result in fratricide. As a result, the war fighter is left with the choice of communication loss or effective neutralization.

Figure 11:
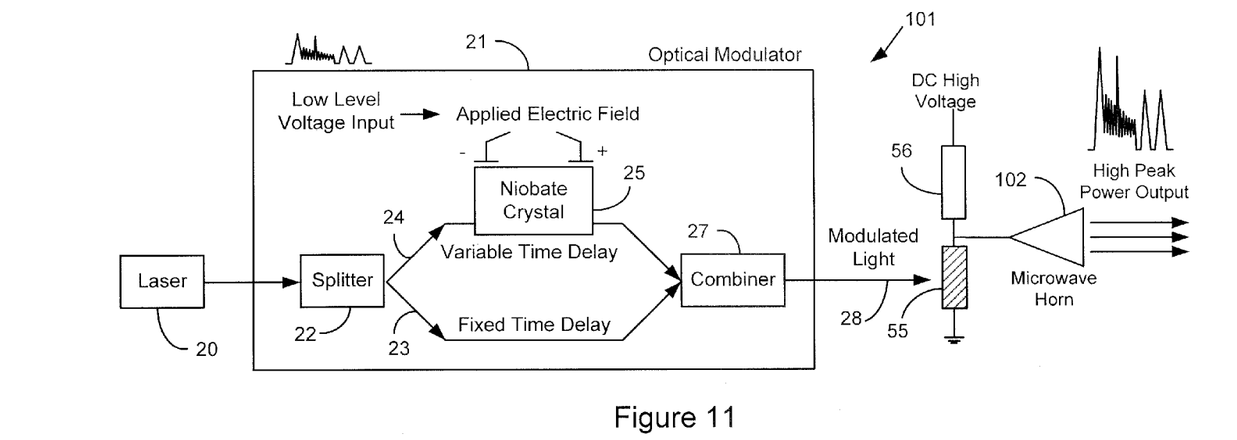
FIG. 11 is a schematic view of a first exemplary application-based arrangement of the present invention configured for high power microwave applications, and having the modulated radiation source of FIG. 3, the voltage divider arrangement of FIG. 6B, and with the output port connected to a microwave horn for transmitting high power microwaves.
Figure 12:
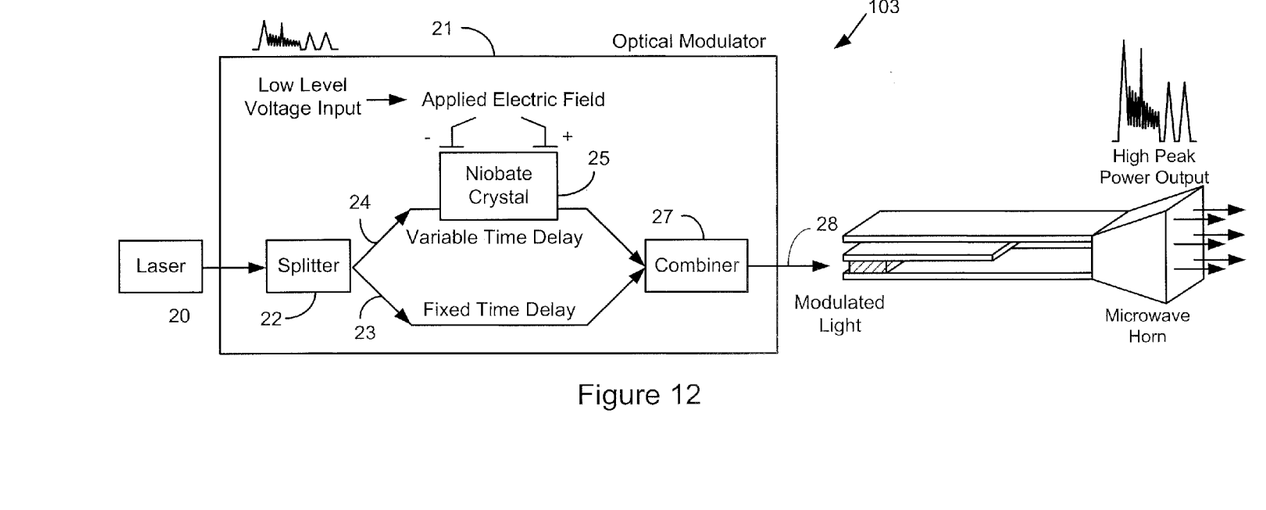
FIG. 12 is a schematic view of an second exemplary application-based arrangement, similar to FIG. 11, but having the microwave horn connected to the output port of the pulse forming line of FIG. 7, for transmitting high power microwaves.

In this regard, FIGS. 11 and 12 show two schematic views of the present invention configures for high power microwave generation and transmission. In particular, FIG. 11 is a schematic view of a first exemplary application-based arrangement 101 of the present invention configured for high power microwave applications, and having the modulated radiation source of FIG. 3, the voltage divider arrangement of FIG. 6B, and with the output port connected to a microwave horn for transmitting high power microwaves. A microwave horn 102 is connected to the output port of the voltage divider such that the modulated electrical signal generated by the modulated variable resistor drives the microwave horn to produce a high peak power output that, as shown in the figure, amplifies the low level voltage input that was applied to the niobate crystal 25. And FIG. 12 shows a similar arrangement 103 as in FIG. 11, except a pulse forming line (such as a Blumlein type) is used, with the microwave horn connected to the output end of the pulse forming line. In this manner, a low level electrical signal generated by a active-reactive jamming equipment may be applied to a high power transmitter for broadcast. Using only the low level portion of such as system would enable this technology to be used in the directed energy neutralization area. And conversion of such an electrical signal to directed energy HPM can be realized with the use of electro-optic modulators. Such a device is shown in FIG. 4.

Example Application: Modulation of Charged Particles

The modulation of charged particle beams has historically been a critical area of interest. In the case of electron beams, this is especially true, because of the ability of modulated electron beams to produce high-power coherent electromagnetic radiation. Modulation of beams can be divided into density modulation, in which the density of the beam varies along its length, and velocity or energy modulation, in which the energy of a beam (and its velocity, for nonrelativistic beams) varies along its length. A number of techniques have been used to generate modulated beams, such as the use of modulated voltage on grids (as in triodes), or interaction with electromagnetic fields in resonant cavities (such as in klystrons) or slow wave structures (such as in traveling wave tubes). Generally, modulated lasers have not been used to generate modulated particle beams. One exception to this is the use of a modulated laser to produce modulated electron beams through photoemission, as described in the documents describing the prior art. This technique does not have the ability to directly produce velocity-modulated beams, although the density modulation can be converted to velocity modulation under certain circumstances. In addition, this technique is limited to production of electrons, so it is not useful, for example, in modulation of proton beams.

Figure 13:
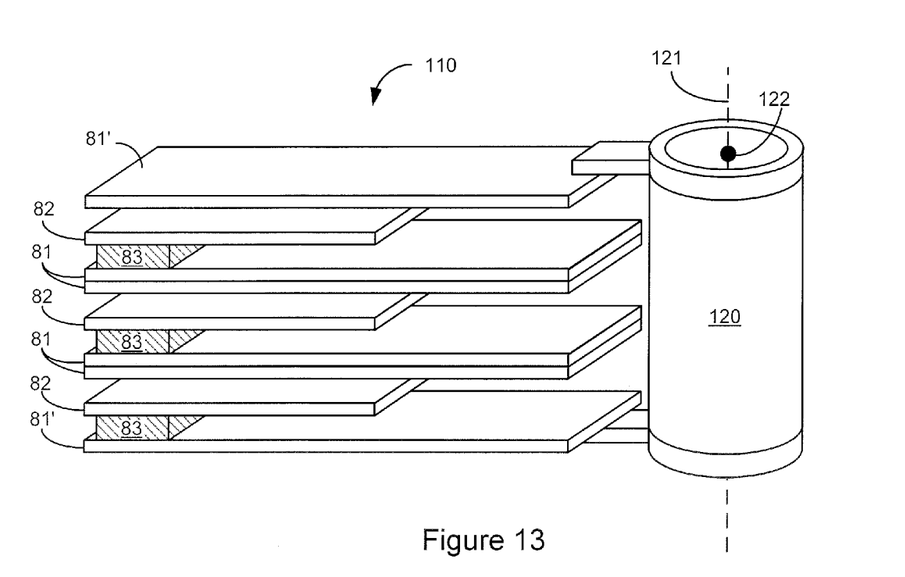
FIG. 13 is a schematic view of an third exemplary application-based arrangement of the present invention configured for modulating charged particles in a dielectric wall accelerator (DWA) arrangement.

And FIG. 13 is a schematic view of an third exemplary application-based arrangement 110 of the present invention configured for modulating charged particles in a dielectric wall accelerator (DWA) arrangement. In particular, a stack of pulse forming lines are shown having a similar configuration as in FIG. 9 with grounded electrodes 81, 81' and precharged center electrodes 82, and connected (at the outermost electrodes 81') to a dielectric wall beam tube 120 having a beam axis 121. Additionally a charged particle source 122 is shown in the beam tube such that activation of the PWBSM resistors modulates charged particles generated therefrom. Generally, with this configuration, the modulation can be performed to accelerate charged particles, to modulate energy/velocity of the charged particles, or to bunch/debunch (i.e. longitudinal focusing/defocusing) the charged particles. A grid (not shown) may optionally be provided at one or both ends of the dielectric wall beam tube 120. Furthermore, the beam tube may be positioned as a subsystem in various systems, such as to replace an input cavity on a microwave tube such as a klystron, or placed upstream of a source of electromagnetic radiation, such as a slow wave structure or periodic magnet array, in order to increase their efficiency or reduce their size.

Figure 15:
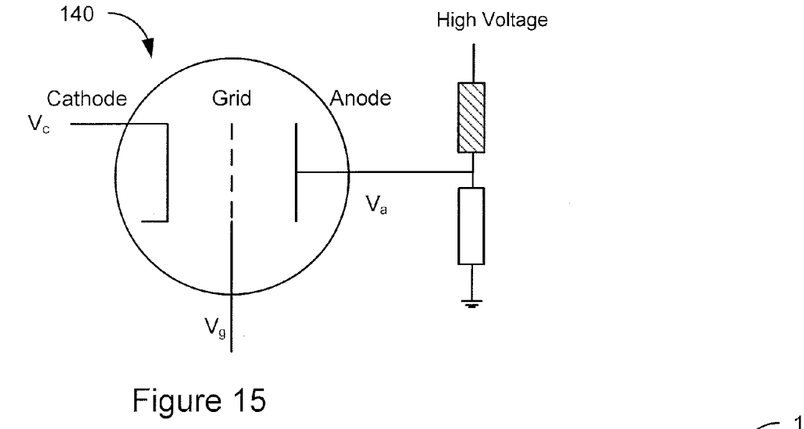
FIG. 15 is a schematic view of a fourth exemplary application-based arrangement of the present invention configured to modulate an anode voltage in a triode arrangement.
Figures 16, 17:
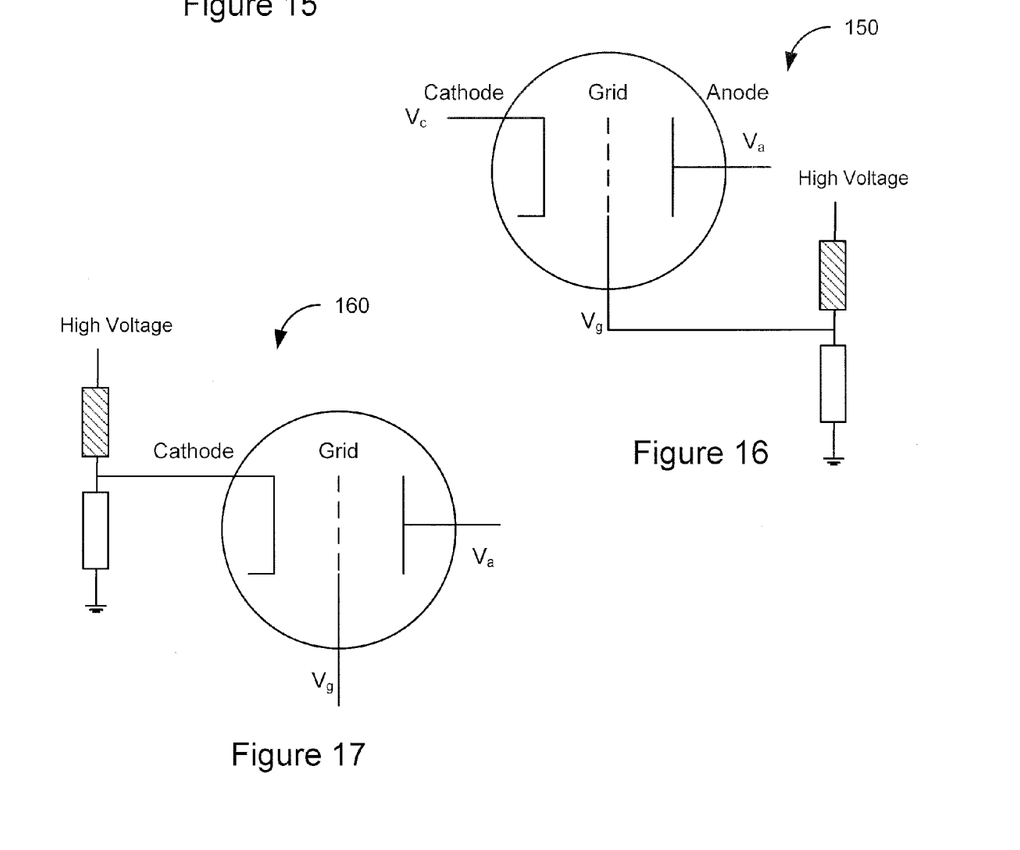
FIG. 16 is a schematic view of a fifth exemplary application-based arrangement similar to FIG. 15 and configured to modulate a grid voltage in a triode arrangement.
FIG. 17 is a schematic view of a sixth exemplary application-based arrangement similar to FIG. 15 and configured to modulate a cathode voltage in a triode arrangement.

Another application of charged particle modulation is by providing a triode configuration, as shown in FIGS. 15-17. In these figures, a voltage divider arrangement similar to that shown in FIG. 6A is used to provide a modulated voltage to one of the anode, cathode, and grid in a triode arrangement. In particular, the arrangement 140 shown in FIG. 15 is configured to modulate an anode voltage in a triode arrangement, the arrangement 150 shown in FIG. 16 is configured to modulate a grid voltage in a triode arrangement, and the arrangement 170 shown in FIG. 17 is configured to modulate a cathode voltage in a triode arrangement. It is appreciated that the triode preferably extends into a region (such as an enclosure, shown as a circle) that is either evacuated or filled with gas. When used to drive vacuum or gaseous electronics devices, the connections would be made by electrical conductors that penetrate the enclosure so that they can be attached to components (like grids) in the vacuum or gas region. In this manner, by choosing which one the three electrodes is connected to the output port (for the modulated electrical signal), the triode may be used to repel, deflect, or accelerate charged particles that are present in the enclosure. The principle of its operation is that a heated cathode (either directly or indirectly by means of a filament) causes a space charge of electron may be attracted to the positively charged plate (anode) and create a current. Applying a negative charge to the control grid will tend to repel some of the (also negatively charged) electrons back towards the cathode: the larger the charge on the grid, the smaller the current to the plate. If an AC signal is superimposed on the DC bias of the grid, an amplified version of the AC signal appears in the plate circuit.)

While particular operational parameters, such as sequences, materials, temperatures, parameters, and particular embodiments have been described and or illustrated, such are not intended to be limiting. Modifications and changes may become apparent to those skilled in the art, and it is intended that the invention be limited only by the scope of the appended claims.

We claim:

1. A system for producing modulated electrical signals comprising:
 a variable resistor comprising a photoconductive wide bandgap semiconductor material whose conduction response to changes in amplitude of incident radiation is substantially linear throughout a non-saturation region thereof to enable operation in non-avalanche mode;
 a modulated radiation source for producing amplitude-modulated radiation with which to direct upon the variable resistor so as to modulate the conduction response within the non-saturation region thereof; and
 a voltage source and an output port, both operably connected to the variable resistor so that an electrical signal produced at the output port by way of the variable resistor is modulated by the variable resistor so as to have a waveform substantially similar to the amplitude-modulated radiation.

2. The system of claim 1,
 wherein the modulated radiation source is of a type selected from a group consisting of a modulated electromagnetic radiation source, and a modulated particle radiation source.

3. The system of claim 2,
 wherein the modulated electromagnetic radiation source is a modulated light source comprising: a light source for producing a light beam capable of producing the conduction response in the variable resistor; and an optical modulator for intensity-modulating the light beam.

4. The system of claim 2,
 wherein the modulated electromagnetic radiation source is a modulated x-ray source comprising: a cathode; an anode conversion target; and a grid electrode for modulating electron production at the cathode with which to direct upon the anode conversion target to produce intensity-modulated x-rays therefrom with which to direct upon the variable resistor to modulate the conduction response thereof.

5. The system of claim 2,
 wherein the modulated particle radiation source comprises a radioactive source and a particle modulator for modulating the radioactive particles therefrom with which to direct upon the variable resistor to modulate the conduction response thereof.

6. The system of claim 2,
 wherein the modulated particle radiation source is a modulated electron source comprising: a cathode; and a grid electrode for modulating electron production at the cathode with which to direct upon the variable resistor to modulate the conduction response thereof.

7. The system of claim 2,
 wherein the modulated particle radiation source comprises a particle radiation source having a pointed tip and a particle modulator for modulating the extraction of particles therefrom.

8. The system of claim 1,
 wherein the voltage source, the variable resistor, and the output port are operably connected so that modulating the conduction response of the variable resistor with the amplitude-modulated radiation generates the modulated electrical signal at the output port.

9. The system of claim 8,
 further comprising a load serially connected to the variable resistor with the output port electrically connected across one of the load and the variable resistor.

10. The system of claim 9,
 further comprising a second output port electrically connected across the other one of the load and the variable resistor.

11. The system of claim 8, further comprising:
 a triode comprising an anode having an associated voltage $V_a$, a cathode having an associated voltage $V_c$, and a grid electrode having an associated voltage $V_g$ for controlling triode operation, with the output port connected to one of the anode, the cathode, and the grid electrode to modulate a corresponding one of the voltages $V_a$, $V_c$, or $V_g$.

12. The system of claim 8,
 further comprising a pulse forming line having a first conductor connected to and pre-charged by the voltage source, and a second conductor parallel to the first conductor and at ground potential, said output port comprising adjacent output ends of the first and second conductors, and said variable resistor bridging the first and second conductors at a removed location from the output ends.

13. The system of claim 12,
 wherein the pulse forming line has a third conductor parallel to the first conductor and opposite the second conductor, said third conductor having an output end adjacent the output end of the first conductor and electrically connected to the second conductor at a removed location from the output ends.

14. The system of claim 12,
 further comprising at least one additional pulse forming line in stacked arrangement with the pulse forming line so that the modulated electrical signals produced at the respective output ports are additive.

15. The system of claim 1,
 wherein the voltage source is a pulse generator; and
 further comprising a transmission line having an input end connected to the pulse generator, an output end comprising the output port, and a photoconductivity-modulated inline section comprising the variable resistor located between the input and output ends, for propagating an incident voltage pulse from the input end to the output port via the photoconductivity-modulated section, so that modulating the conduction response of the variable resistor with the amplitude-modulated radiation substantially impresses the waveform of the amplitude-modulated radiation to transmitted and reflected portions of the incident voltage pulse.

16. The system of claim 15,
 wherein the photoconductivity-modulated section of the transmission line, when not activated, has a matching impedance with adjacent sections of the transmission line so as to pass the incident voltage pulse without reflection.

17. The system of claim 15,
 wherein the transmission line includes at least one additional photoconductivity-modulated inline section comprising another variable resistor, with the modulated radiation source directing the amplitude-modulated radiation to all the photoconductivity-modulated sections.

18. The system of claim 15,
wherein the transmission line includes at least one additional photoconductivity-modulated inline section comprising another variable resistor, and
further comprising at least one additional modulated radiation source for producing amplitude-modulated radiation independently of the other modulated radiation source with which to direct upon the additional photoconductivity-modulated section.

19. The system of claim 15,
further comprising a second output port at the input end of the transmission line for emitting the reflected portions of the incident voltage pulse.

20. The system of claim 1, further comprising:
at least one additional variable resistor and associated output port; and
a phase controller for controlling the phase of a corresponding amplitude-modulated radiation directed upon the respective variable resistors so as to control the phase of the modulated electrical signals at the respective output ports.

21. The system of claim 1,
further comprising a transmission device connected to the output port for transmitting the modulated electrical signal.

22. The system of claim 21,
wherein the transmission device is an antenna.

23. The system of claim 22,
wherein the modulated radiation source produces the amplitude-modulated radiation at a microwave frequency, so that a microwave signal is transmitted via the antenna.

24. The system of claim 1,
further comprising an evacuated dielectric wall beam tube having an input end for receiving charged particles, the output port connected along the beam tube so that charged particles present in the beam tube receive an energy modulation corresponding to the modulated electrical signal at the output port so as to produce a modulated charged particle beam.

25. A method of producing modulated electrical signals comprising:
providing a voltage source, an output port, and a variable resistor operably connected to the voltage source and the output port so that an electrical signal is produced at the output port by way of the variable resistor, said variable resistor comprising a photoconductive wide bandgap semiconductor material whose conduction response to changes in amplitude of incident radiation is substantially linear throughout a non-saturation region thereof, whereby the variable resistor is operable in non-avalanche mode; and
directing upon the variable resistor amplitude-modulated radiation produced by a modulated radiation source to modulate the conduction response of the variable resistor within the non-saturation region thereof, so that the electrical signal produced at the output port is modulated by the variable resistor so as to have a waveform substantially similar to the amplitude-modulated radiation.

26. A photoconductivity-modulated variable resistor device comprising:
a photoconductive wide bandgap semiconductor material (PWBSM) whose conduction response to changes in amplitude of incident radiation is substantially linear throughout a non-saturation region thereof, whereby the PWBSM is operable in non-avalanche mode as a variable resistor; and
a modulated radiation source for producing amplitude-modulated radiation with which to direct upon the PWBSM so that the conduction response induced thereby in the PBWSM is modulated within the non-saturation region thereof, and has a waveform substantially similar to the amplitude-modulated radiation.

* * * * *